United States Patent
Moharir et al.

(10) Patent No.: US 8,106,463 B2
(45) Date of Patent: Jan. 31, 2012

(54) MEMORY CELLS FOR READ ONLY MEMORIES

(75) Inventors: Sudhir S. Moharir, Santa Clara, CA (US); Zhigeng Liu, Milpitas, CA (US)

(73) Assignee: ARM, Inc., Sunnyvale, CA (US)

( * ) Notice: Subject to any disclaimer, the term of this patent is extended or adjusted under 35 U.S.C. 154(b) by 818 days.

(21) Appl. No.: 11/296,029

(22) Filed: Dec. 6, 2005

(65) Prior Publication Data

US 2007/0126049 A1 Jun. 7, 2007

(51) Int. Cl.
*H01L 21/70* (2006.01)
(52) U.S. Cl. ............ 257/391; 257/390; 257/E21.667; 257/E21.67; 257/E27.102
(58) Field of Classification Search ............ 257/E21.67, 257/E21.667, E27.102, 390, 391
See application file for complete search history.

(56) References Cited

U.S. PATENT DOCUMENTS

| | | | | |
|---|---|---|---|---|
| 5,786,618 | A * | 7/1998 | Wen ............... | 257/391 |
| 6,252,797 | B1 * | 6/2001 | Hasegawa ............... | 365/178 |
| 2003/0045059 | A1 * | 3/2003 | Han ............... | 438/275 |

* cited by examiner

*Primary Examiner* — Thanh V Pham
*Assistant Examiner* — Amar Movva
(74) *Attorney, Agent, or Firm* — Nixon & Vanderhye P.C.

(57) ABSTRACT

A ROM memory cell has significantly less total area than previously known ROM memory cells. Instead of using only one layer in the manufacturing process to program the memory cells, at least two layers are used to program the memory cells. This flexibility allows the memory cell to be reduced in area, which in turn produces a ROM that is more area efficient and consequently lower in cost. As the bitline length and capacitance are reduced, the speed and power consumption are also improved.

5 Claims, 6 Drawing Sheets

MEMORY CELLS FOR READ ONLY MEMORIES

FIELD OF THE INVENTION

The present invention relates generally to semiconductor Integrated Circuit (IC) memory design and manufacture. In particular it relates to Read Only Memory (ROM) design and manufacture.

BACKGROUND

ROM is well known in the art. ROM typically contains instructions or data that are both unchanging and critical for the operation of the electrical device into which it is incorporated. The contents of the ROM dictate the physical structure of the ROM, as the zeros and ones that comprise the ROM's digital contents are realized as functional or non-functional transistors, respectively.

In known ROM fabrication, the contents of the ROM memory have typically been programmed into the ROM using only one process layer. The layer used has been either the diffusion layer, the contact layer, or the via layer.

Figure 1A:
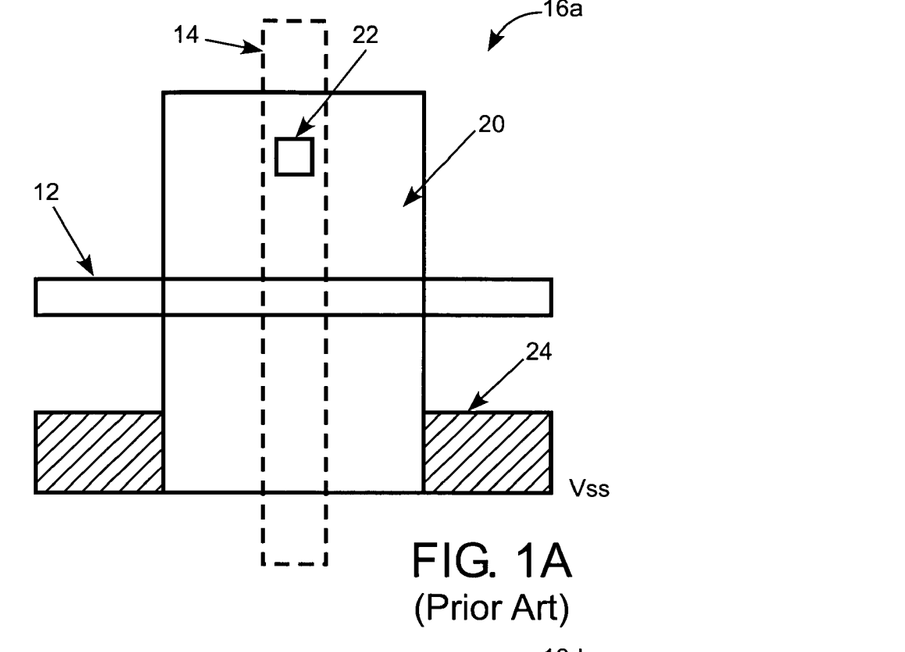
FIG. 1a is an illustration showing a conventional diffusion programmable ROM memory cell, programmed as a "0" cell.

FIG. 1a is an illustration showing a conventional diffusion programmable ROM memory cell 16a, programmed as a "0" cell. The "0" cell 16a includes a wordline 12 coupled to a diffusion layer 20, a bitline contact 22 coupling the diffusion layer 20 to a bitline 14, and a ground diffusion wire 24 that is coupled to ground.

Initially the bitline 14 is charged high to a logical "1." As long as wordline 12 is low, bitline 14 remains high because the diffusion layer 20 isolates bitline contact 22 from the ground diffusion wire 24. However, when wordline 12 is asserted high, diffusion layer 20 becomes conductive and bitline 14 is pulled low. Asserting wordline 12 high charges diffusion layer 20 and causes it to conduct, creating a connection between bitline contact 22 and ground diffusion wire 24. As bitline 14 is coupled to bitline contact 22 and thus to ground diffusion wire 24 via diffusion layer 20, bitline 14 is pulled low.

Figure 1B:
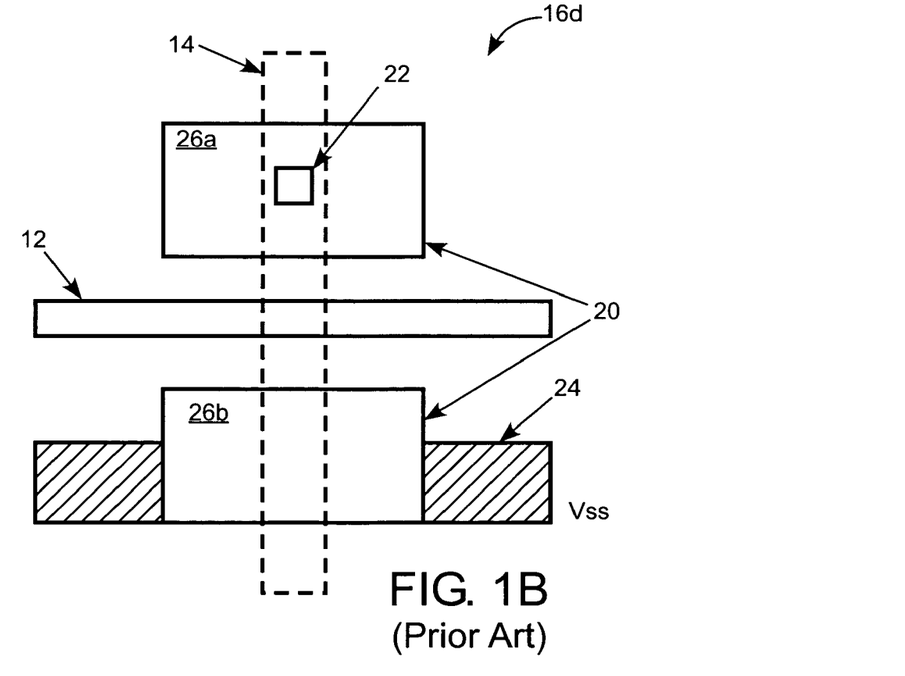
FIG. 1b is an illustration showing a conventional diffusion programmable ROM memory cell, programmed as a "1" cell.

FIG. 1b illustrates a conventional diffusion programmable ROM memory cell 16d, programmed as a "1" cell. The "1" memory cell 16d includes a wordline 12, a diffusion layer 20 separated into a first portion 26a and a second portion 26b, a bitline contact 22 coupling the first portion 26a of the diffusion layer 20 to a bitline 14, and a ground diffusion wire 24 coupling the second portion 26b of the diffusion layer 20 to ground.

Similar to the "0" cell, the "1" memory cell 16d initially has bitline 14 charged high to a logical "1." As wordline 12 is low, bitline 14 remains high because diffusion layer 20 isolates bitline contact 22 from ground diffusion wire 24. Unlike the "0" cell, the "1" cell allows bitline 14 to remain high when wordline 12 is asserted high. As diffusion layer 20 is removed from around wordline 12, diffusion layer 20 is not charged when wordline 12 is asserted high, and a connection is not formed between bitline contact 22 and ground diffusion wire 24. Bitline 14 is thus never pulled low in the "1" memory cell 16d.

Figure 2:
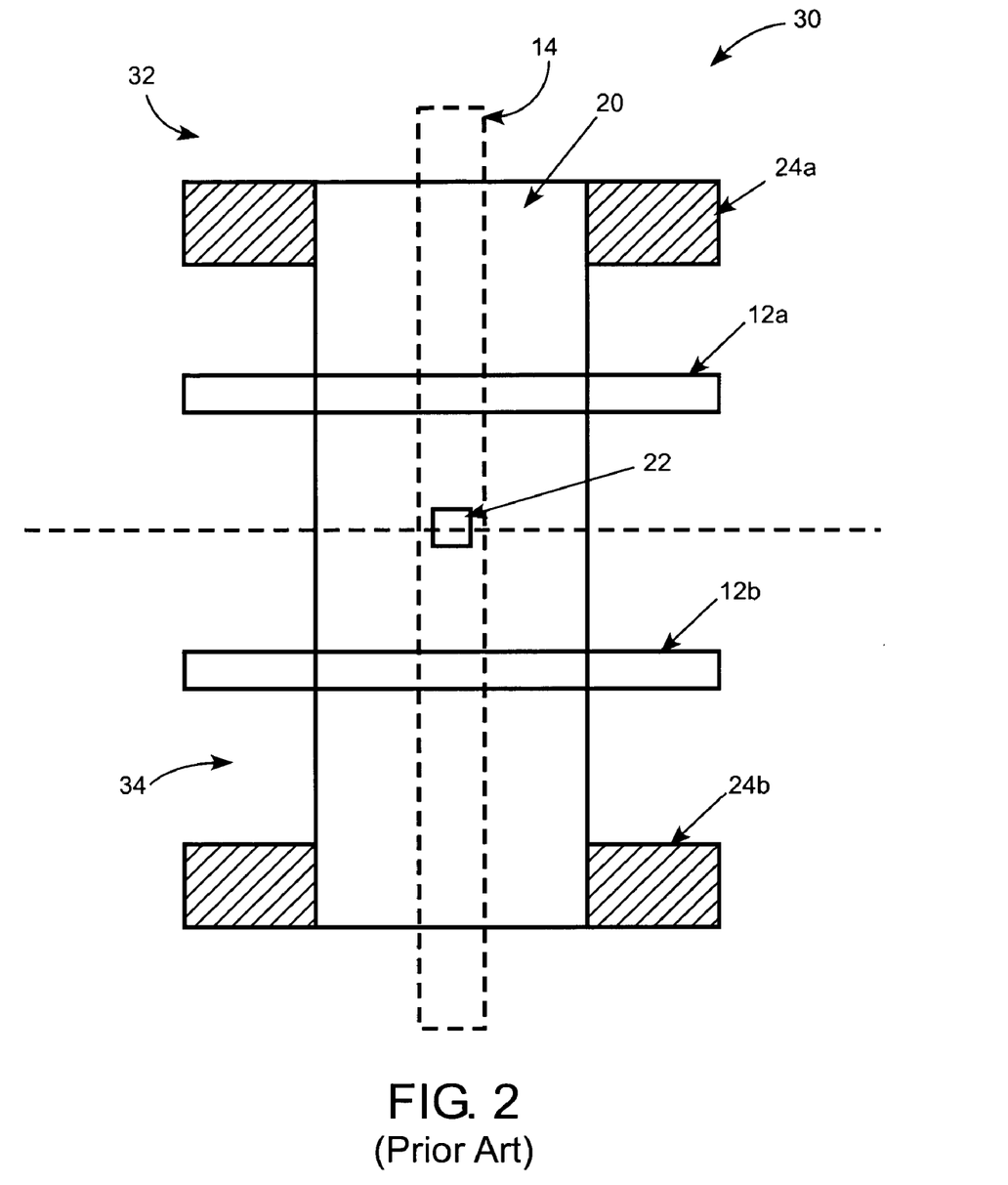
FIG. 2 is an illustration showing a conventional diffusion programmable ROM memory cell array configuration comprising two memory cells.

FIG. 2 is an illustration showing a conventional diffusion programmable ROM memory cell array 30 comprised of two memory cells. Cell array 30 includes a first memory cell 32 and a second memory cell 34. First memory cell 32 includes a first wordline 12a coupled to a diffusion layer 20, a shared bitline contact 22 coupling a bitline 14 to the diffusion layer 20 and a first ground diffusion wire 24a coupling diffusion layer 20 to ground.

Second memory cell 34 shares the diffusion layer 20 with first memory cell 32 and includes a second wordline 12b coupled to diffusion layer 20. Second memory cell 34 also includes shared bitline contact 22 that couples bitline 14 to diffusion layer 20 and a second ground diffusion wire 24b coupling diffusion layer 20 to ground.

In operation, first wordline 12a is utilized to address first memory cell 32 and second wordline 12b is utilized to address second memory cell 34, both of which can affect bitline 14.

For first memory cell 32, bitline 14 is initially charged high to a logical "1." While first wordline 12a is low, bitline 14 maintains its state, usually high, because diffusion layer 20 isolates shared bitline contact 22 from the first ground diffusion wire 24a. However, when first wordline 12a is asserted high, bitline 14 is pulled low because diffusion layer 20 becomes conductive between shared bitline contact 22 and first ground diffusion wire 24a.

Asserting first wordline 12a high charges diffusion layer 20 between shared bitline contact 22 and first ground diffusion wire 24a and causes it to conduct, creating a connection between shared bitline contact 22 and first ground diffusion wire 24a. As bitline 14 is coupled to shared bitline contact 22, and therefore also to first ground diffusion wire 24a via diffusion layer 20, bitline 14 is pulled low.

Second memory cell 34 operates in a similar manner. Asserting second wordline 12b high charges diffusion layer 20 between shared bitline contact 22 and second ground diffusion wire 24b and causes it to conduct, creating a connection between shared bitline contact 22 and second ground diffusion wire 24b. As bitline 14 is coupled to shared bitline contact 22 and also to second ground diffusion wire 24b via charged diffusion layer 20, bitline 14 is pulled low.

Current semiconductor processes are complicated undertakings, requiring dozens of steps, each of which steps taking up time and introducing materials handling and inventory factors. Customers expect that the turn-around time or cycle time to be kept as short as possible. Unfortunately, as the code for data and programs stored in the ROM are fixed at the time of manufacture, an error in the ROM code results in wasted ROM wafers. For example, if the ROM includes program code and a bug is later discovered in the program code, wafers containing ROMs are wasted if the wafers have already been processed past the processing step required for programming the ROMs.

For the preceding reason at least, programming is preferably done as late in the manufacturing process as possible. As the diffusion layer must be formed early in the manufacturing process, a diffusion programmable ROM must be programmed early in the manufacturing process. In response to this shortcoming, via programmable ROMs were developed that allow for late process programming.

Figure 3:
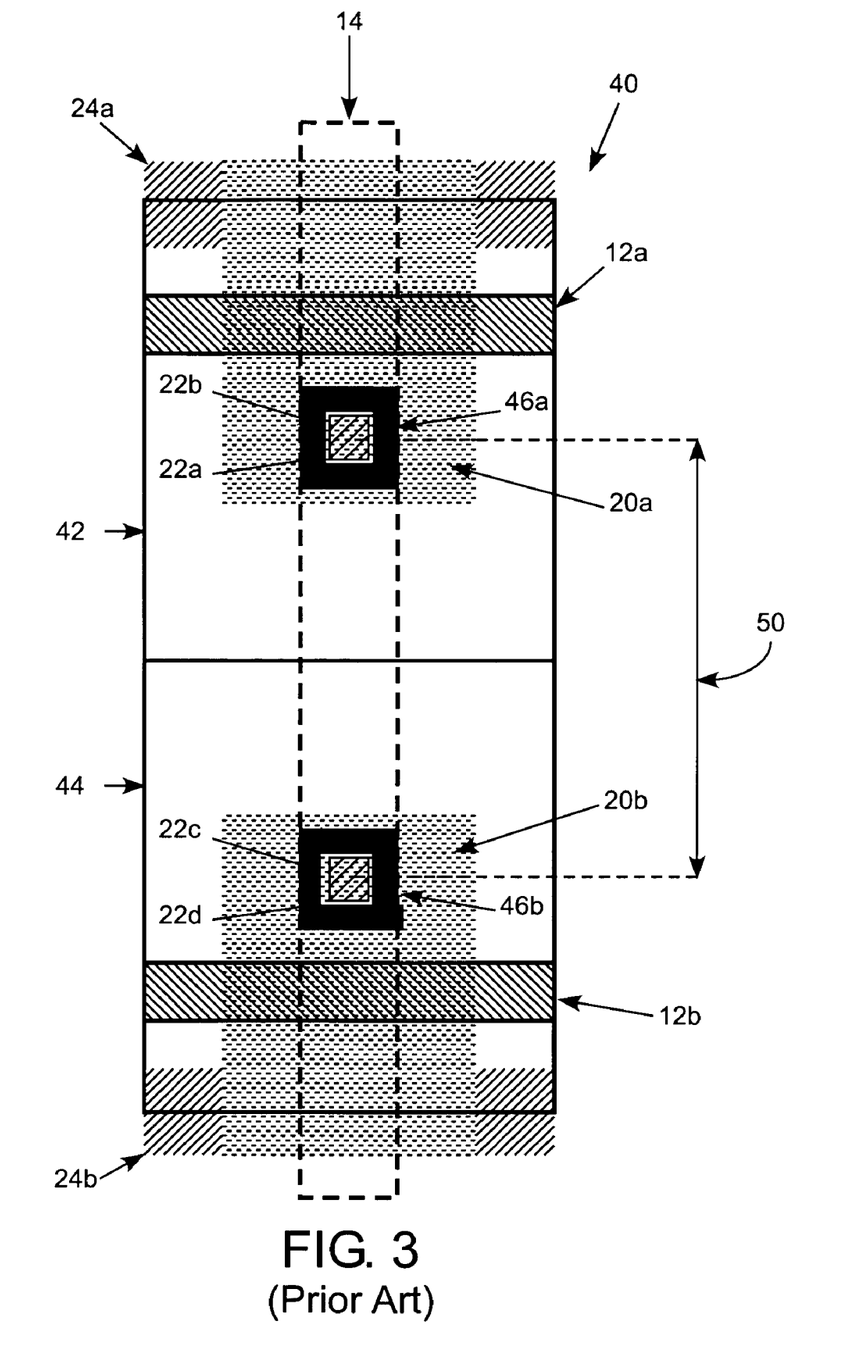
FIG. 3 is an illustration showing a conventional via programmable ROM memory cell array configuration comprising two memory cells.

FIG. 3 is an illustration showing a conventional via programmable ROM cell array 40 comprised of two memory cells. Via programmable ROM cell array 40 includes first memory cell 42 and a second memory cell 44. First memory cell 42 includes a first diffusion layer 20a coupled to a first wordline 12a, a first ground diffusion wire 24a, a first metal to diffusion contact 22a which couples a first m1 pad 46a to drain diffusion 20a of first memory cell 42 and a first m2 to m1 via 22b which couples first m1 pad 46a to m2 bitline 14. Similarly, second memory cell 44 includes a second diffusion layer 20b coupled to a second wordline 12b, a second ground diffusion wire 24b, a second diffusion contact 22c, a second m1 pad 46b, and a second m2 to m1 via 22d which couples to bitline 14.

Via-programmable ROM cell array 40 operates similarly to the diffusion programmable ROM cell array discussed previously. In first memory cell 42, when first wordline 12a is low, first diffusion layer 20a is nonconductive and no current flows through first m2 to m1 via 22b to first m1 pad 46a down through first metal to diffusion contact 22a to ground diffusion wire 24a. When first wordline 12a is asserted high, first diffusion layer 20a becomes charged and conductive, forming a conduction path between first metal to diffusion contact 22a and first m1 pad 46a and first m2 to m1 via 22b and diffusion ground wire 24a. As bitline 14 is coupled to first m2 to m1 via 22b via first m1 pad 46a and first metal to diffusion contact 22a, bitline 14 goes low, resulting in a logical "0." Second memory cell 44 operates in a similar manner.

Both first and second memory cells 42 and 44 are "0" cells because they allow bitline 14 to go low when their corresponding wordline 12a/12b is selected. To make a via programmable ROM memory cell a "1" cell, bitline m2 to m1 via is removed. For example, removing first bitline m2 to m1 via 22b will program the first memory cell 42 to a "1" cell.

As the memory cells in a via programmable ROM are programmed by altering the via layer rather than the diffusion layer, a via programmable ROM can be programmed later in the manufacturing process, when the via layers are formed. In this manner, production can be initiated on a wafer of via programmable ROMs, and held at a later stage in the manufacturing process. Micro-code for the ROMs can be upgraded with a minimal amount of time required to modify the via masks and complete processing of the wafers. Thus, via programmable ROMs provide greater flexibility than diffusion programmable ROMs.

As shown in FIG. 3, bitline contacts 22a/22c, m1 pads 46a/46b, and m2 to m1 vias 22b/22d cannot be shared in the via programmable ROM memory cell array 40. Each memory cell 42/44 must be formed on a separate portion of diffusion, resulting in wasted space 50. More particularly, space 50 between first m1 pad 46a and second m1 pad 46b is wasted. Thus, conventional via programmable ROMs are less dense and larger than conventional diffusion programmable ROMs.

As a result, semiconductor chip designers conventionally had to choose between the flexibility provided by via programmable ROMs and the density provided by diffusion programmable ROMs.

Further, there exist minimum size rules that restrict the size of a piece of diffusion used in semiconductor manufacturing to a predetermined minimum diffusion size, as a result of manufacturing limitations in the semiconductor manufacturing processes. A transistor designed on a very small portion of diffusion will be restricted in practice to using a larger diffusion size if the particular designed size of diffusion is smaller than the predetermined minimum diffusion size.

Thus, each "1" cell of a conventional diffusion programmable ROM requires two separate diffusion zones, each being no smaller than the predetermined minimum diffusion size. Similarly, all memory cells of a conventional via programmable ROM are formed on separate portions of diffusion, each being no smaller than the predetermined minimum diffusion size. Thus, there is a minimum size that conventional programmable ROMs must be.

Figure 4:
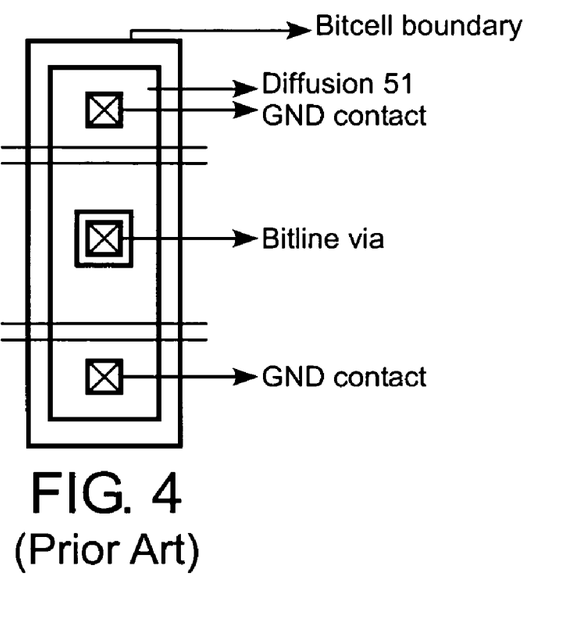
FIG. 4 illustrates a conventional contact ROM bitcell.

The contact programmable ROM cell shown in FIG. 4 uses a single diffusion island 51 to create the "0-0" bitcell. A diffusion island cannot be shared across horizontal boundaries when these bitcells are stacked vertically. Contact layer programming is used to connect the source of the bitcell transistors to the metal 1 ground. If the diffusion island was shared across boundaries, the individual programmability would be lost as the diffusion islands would already be connected. This requirement results in a ROM using contact layer programming being larger in area than other known ROMs.

The need for ROM cells of smaller size therefore cannot be met by currently known designs and manufacturing processes.

SUMMARY

A first preferred example embodiment discloses a ROM memory cell that has significantly less total area than known ROM memory cells. Instead of using only one layer in the manufacturing process to program the memory cells, at least two layers are used to program the memory cells. This flexibility allows the memory cell to be reduced in area, which in turn produces a ROM that is more area efficient and consequently lower in cost.

In the first preferred embodiment the layers that are used to program the memory cell are the diffusion and contact layers. In another embodiment the diffusion and Vial layers are used to program the memory cell.

DETAILED DESCRIPTION

Figure 5:
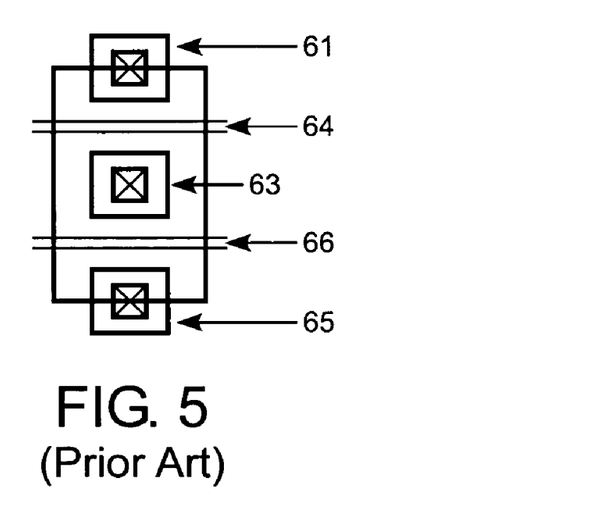
FIG. 5 illustrates a known diffusion ROM bitcell.

Referring now to FIG. 5, a known "1-1" bitcell fabricated in the diffusion layer is illustrated. Three separate diffusion islands are needed: diffusion islands 61 and 65 for ground connections and diffusion island 63 for a bitline connection. Polysilicon spacers 64 and 66 separate the diffusion islands. The minimum height of the bitcell is dictated by the three diffusion islands, each with their own required minimum area and the requisite spacing between them created by polysilicon spacers 64 and 66.

Figure 6:
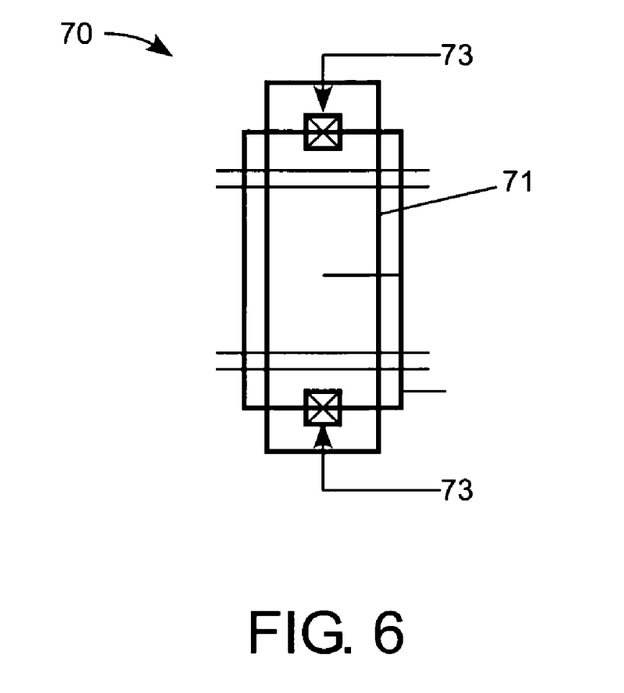
FIG. 6 illustrates a "1-1" bitcell fabricated using a first example embodiment.

As shown in FIG. 6, a two-mask bitcell 70 uses only a single diffusion island 71. In this example embodiment, both the diffusion and contact layers are modified. This single diffusion island 71 is sufficiently large to meet the required minimum area of a diffusion island dictated by the particular process used to make the ROM. No polysilicon spacers are required by bitcell 70 as there is only a single diffusion island. Ground contacts 73 at either end of bitcell 70 complete the "1-1" case. The removal of the central bitline contact shown in the prior art permits the use of a single continuous diffusion zone. On average, different example embodiments reduce memory cell area by approximately 40%. Smaller memory cells allow for either a memory with more storage for the same IC area or a smaller IC for a memory of the same capacity, as compared to ICs with known ROM memory cells.

The exact area savings depends upon the fabrication technology and the design rules used by the particular foundry.

With memory cells of reduced height, the bitline capacitances are also reduced. Reduced bitline capacitances result in a larger voltage drop per unit time when reading a "zero" from the memory cell. This permits a reduced access time for the memory cell. The reduced bitline capacitances also reduce the amount of time that is required to pre-charge the bitlines, again further reducing the overall memory cell cycle time. With both the access time and the memory cell cycle time reduced, the overall speed of a ROM using one of the preferred embodiments increases. As the average power dissipated by a memory is proportional to its capacitance, the reduction in bitline capacitances also reduces overall ROM power consumption.

As two layers in the manufacturing process are used to program the memory cell, changes in the ROM's programming or errors in the design will require new masks for both layers used in the programming process. Although changing or replacing two masks is a greater expense than changing one, which is typically the number of masks that must be repaired or replaced when a ROM is reprogrammed, the extra cost is not of great consequence. Typically, most ROMs are only programmed once, so there is no disadvantage in that situation. Further, even when the ROM does need to be reprogrammed, the new masks would typically increase IC cost by only 3-4%. Given the area savings enabled, this extra mask cost only slightly offsets the savings offered by the smaller ROM cell size.

It is possible to build the "1-1" bitcell using no diffusion island at all. However, most semiconductor manufacturing processes require that a certain percentage of the layout area must comprise a diffusion zone. If the code stored in the ROM contains a preponderance of "1s," creating bitcells without diffusion zones would result in the minimum diffusion zone area rule being violated. For this reason, although a diffusion-free ROM would be possible, it cannot be recommended to create a "1-1" bitcell.

Figure 7:
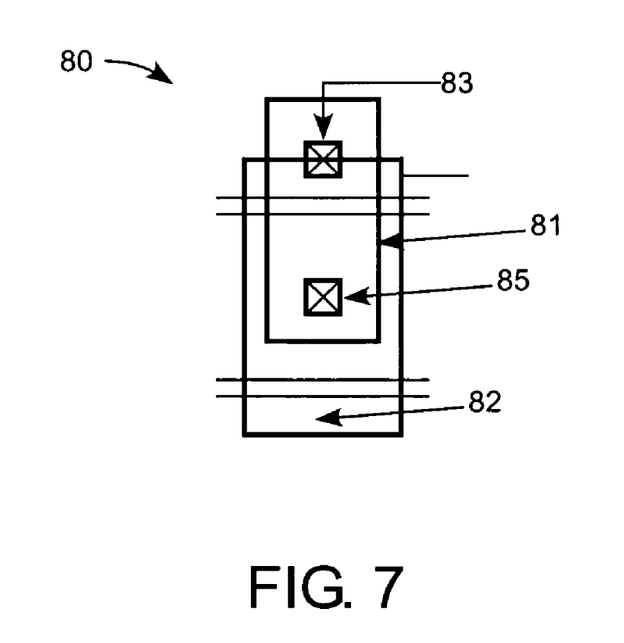
FIG. 7 illustrates a "1-0" bitcell fabricated using the first embodiment.

FIG. 7 illustrates a "1-0" or "0-1" bitcell 80 which is the largest bitcell resulting from the use of this first example embodiment. A single diffusion island 81 is still the only necessary diffusion area. Ground contact 83 and a bitline contact 85 complete the bitcell. The diffusion island is always sized to meet the minimum size requirements of the particular IC fabrication process being used. When two "1-0" bitcells are stacked vertically particular care must be taken to insure that the minimum diffusion island area and minimum required spacing between diffusion islands is observed. The diffusion island that would normally extend further can be removed because the contact has also been removed. Removed diffusion area and removed contact area 82 indicate the IC area that can be saved. Manufacturing rules require that a contact must have an underlying diffusion zone.

Figure 8:
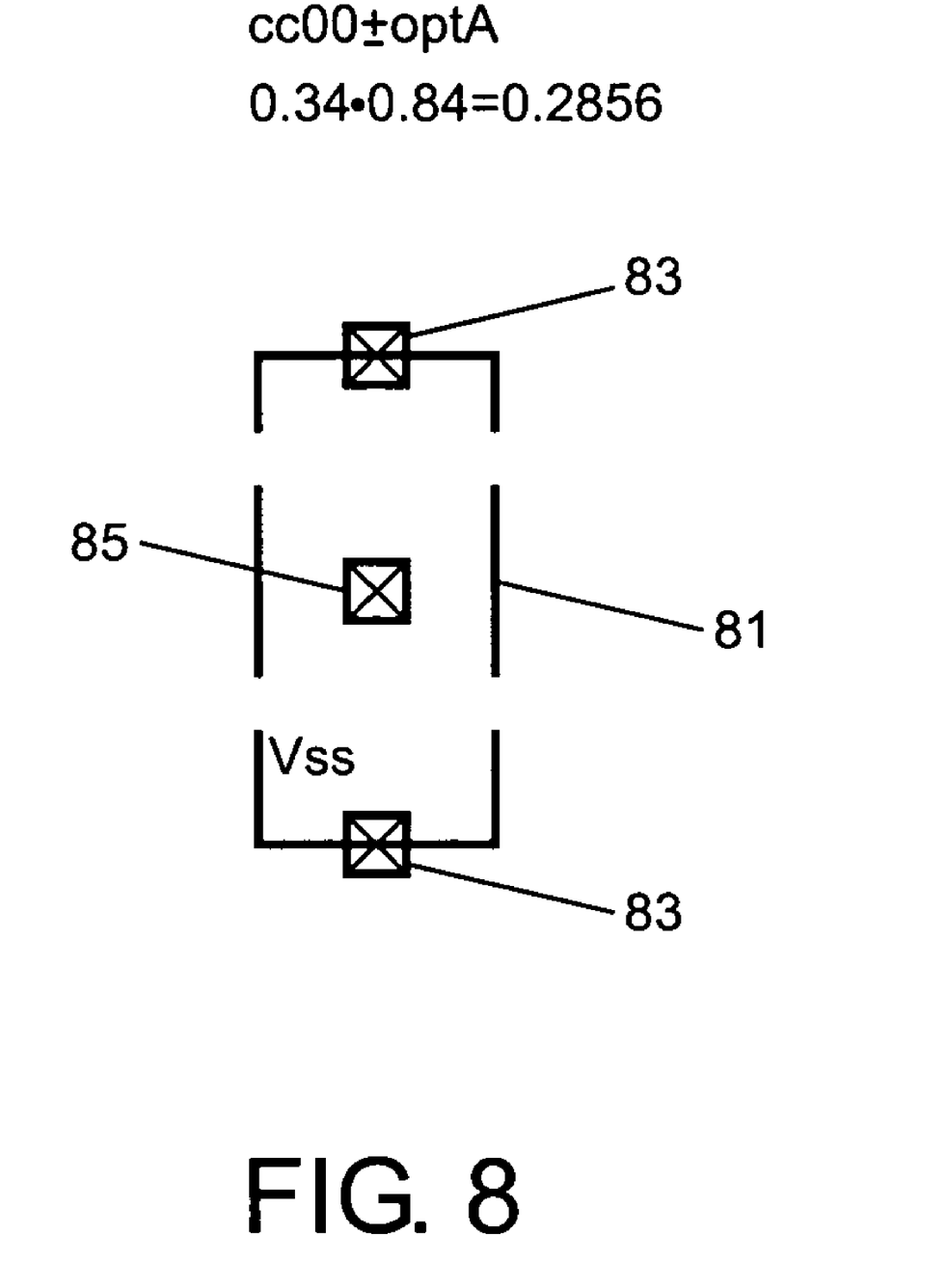
FIG. 8 illustrates a "0-0" bitcell fabricated using the first embodiment.

FIG. 8 illustrates a "0-0" bitcell. The "0-0" cell differs from the "1-0" bitcell in the extension of the diffusion island 81 and the addition of a second ground contact 83. In all other respects, the construction and operation of the bitcell shown in FIG. 8 would be the same as that illustrated in FIG. 7.

What is claimed is:

1. A 1-1 read-only memory cell containing two binary bits, the read-only memory cell comprising:
    a substrate;
    a predefined binary memory cell boundary overlain on the substrate;
    a single diffusion island fabricated in the predefined binary memory cell boundary and upon the substrate; and
    metal contacts formed upon the single diffusion island to define the predetermined binary contents of the memory cell,
    wherein the single diffusion island extends outside the cell boundary and only the single diffusion island and the metal contacts are needed to realize the predetermined binary contents of the memory cell, wherein the 1-1 memory cell stores a binary value of 1-1.

2. The read-only memory cell of claim 1, wherein the substrate is a p-type substrate.

3. The read-only memory cell of claim 1, wherein the substrate is an n-type substrate.

4. A 1-0 read-only memory cell containing two binary bits, the read-only memory cell comprising:
    a substrate;
    a predefined binary memory cell boundary overlain on the substrate;
    a single diffusion island fabricated in the predefined binary memory cell boundary and upon the substrate; and
    metal contacts formed upon the single diffusion island to define the predetermined binary contents of the memory cell,
    wherein the single diffusion island extends outside the cell boundary and only the single diffusion island and the metal contacts are needed to realize the predetermined binary contents of the memory cell, wherein the 1-0 memory cell stores a binary value of 1-1.

5. A 0-1 read-only memory cell containing two binary bits, the read-only memory cell comprising:
    a substrate;
    a predefined binary memory cell boundary overlain on the substrate;
    a single diffusion island fabricated in the predefined binary memory cell boundary and upon the substrate; and
    metal contacts formed upon the single diffusion island to define the predetermined binary contents of the memory cell,
    wherein the single diffusion island extends outside the cell boundary and only the single diffusion island and the metal contacts are needed to realize the predetermined binary contents of the memory cell, wherein the 1-0 memory cell stores a binary value of 1-1.

* * * * *

UNITED STATES PATENT AND TRADEMARK OFFICE
CERTIFICATE OF CORRECTION

PATENT NO. : 8,106,463 B2
APPLICATION NO. : 11/296029
DATED : January 31, 2012
INVENTOR(S) : Moharir et al.

Page 1 of 1

It is certified that error appears in the above-identified patent and that said Letters Patent is hereby corrected as shown below:

In column 6, line 38, delete "1-1" and insert --1-0--.

In column 6, line 52, delete "1-0" and insert --0-1--.

In column 6, line 53, delete "1-1" and insert --0-1--.

Signed and Sealed this
Twelfth Day of June, 2012

David J. Kappos
*Director of the United States Patent and Trademark Office*